United States Patent [19]

Nasr

[11] Patent Number: 5,266,156
[45] Date of Patent: Nov. 30, 1993

[54] METHODS OF FORMING A LOCAL INTERCONNECT AND A HIGH RESISTOR POLYSILICON LOAD BY REACTING COBALT WITH POLYSILICON

[75] Inventor: Andre I. Nasr, Marlboro, Mass.

[73] Assignee: Digital Equipment Corporation, Maynard, Mass.

[21] Appl. No.: 904,389

[22] Filed: Jun. 25, 1992

[51] Int. Cl.$^5$ ............................................. H01L 21/312
[52] U.S. Cl. ..................................... 156/656; 437/200; 437/918; 148/DIG. 106
[58] Field of Search ................ 437/192, 193, 196, 200, 437/201, 202, 918; 156/656, 657; 148/DIG. 136, DIG. 147, DIG. 106

[56] References Cited

U.S. PATENT DOCUMENTS

| | | | |
|---|---|---|---|
| 4,657,628 | 4/1987 | Holloway et al. | 437/200 |
| 4,676,866 | 6/1987 | Tang et al. | 437/200 |
| 4,912,061 | 3/1990 | Nasr | 437/200 |
| 4,968,645 | 11/1990 | Baldi et al. | 148/DIG. 106 |
| 4,980,020 | 12/1990 | Douglas | 156/656 |
| 5,010,032 | 4/1991 | Tang et al. | 437/200 |
| 5,126,279 | 6/1992 | Roberts | 437/918 |

FOREIGN PATENT DOCUMENTS 0036052 2/1989 Japan .................. 148/DIG. 147

OTHER PUBLICATIONS

A New Device Interconnect Scheme for Sub-Micron VLSI by Devereaux C. Chen, et al., 118, IEDM (1984).
VLSI Local Interconnect Level Using Titanium Nitride by Thomas Tang, et al., 590, IEDM (1985).

*Primary Examiner*—Brian E. Hearn
*Assistant Examiner*—C. Chaudhari
*Attorney, Agent, or Firm*—Arnold, White & Durkee

[57] ABSTRACT

Methods of forming local interconnects and high resistor polysilicon loads are disclosed. The local interconnects are formed by depositing a layer of polysilicon over $CoSi_2$ in partially fabricated semiconductor wafers. The polysilicon is then coated with cobalt and annealed to form a second layer of of $CoSi_2$. The method can be expanded to form a high resistor polysilicon load by depositing and patterning an oxide layer to form contact windows before application of the polysilicon layer. Another oxide layer is deposited over the polysilicon and patterned before application of the cobalt layer to define the areas which create the resistor load.

13 Claims, 8 Drawing Sheets

METHODS OF FORMING A LOCAL INTERCONNECT AND A HIGH RESISTOR POLYSILICON LOAD BY REACTING COBALT WITH POLYSILICON

BACKGROUND OF THE INVENTION

1. Field of the Invention

The present invention relates to processes for forming local interconnects and polysilicon resistors on MOS devices. More particularly, the present invention relates to processes of forming local interconnects and polysilicon resistors by reacting cobalt with polysilicon.

2. The Prior Art

High performance ULSI microprocessors require large capacity, on chip SRAM while following the standard technology shrink path from previous generation devices. Polysilicon resistor load four-transistor (4-T) SRAM cells are desirable since they provide the system with the density required for performance enhancement. However, a simplified local interconnect is necessary in order to keep the shrink path from one technology to the next. The local interconnect technique has been suggested as a means to reduce the SRAM cell area by reducing the number of contacts used for interconnects and to provide a reliable alternative method to the buried contact scheme.

Previous local interconnect schemes have concentrated around TiN processes in which the TiN was sputtered on or grown from $TiSi_2$. Other techniques were based on PVD silicon films sputtered over titanium and the simultaneous formation of silicide and local interconnect structures. These techniques have not been reliable enough to be implemented in ULSI processes.

The use of TiN over $TiSi_2$ has been suggested by Holloway et al. in U.S. Pat. No. 4,657,628 and by Tang et al. in U.S. Pat. No. 4,657,866. This technique, however, suffers from many processing problems which prevent the reliable manufacturing of these devices. TiN films which are grown from $TiSi_2$ are very thin for patterning and low sheet resistance. TiN also suffers from the lack of etch selectivity to $TiSi_2$ which makes it extremely hard to control subsequently dry and wet etch processes. Another shortcoming of this technique is the inability to strip the resist off the wafer without degrading the line width control of the TiN local interconnect strap. Hydrogen peroxide, which is used to strip the photoresist mask, can also severely attack the TiN layer.

Another technique has been suggested by Deveraux et al. in, "A New Device Interconnect Scheme For Sub-Micron VLSI," 84 IEDM pages 118–121. In this technique, a thin layer of refractory metal and amorphous silicon are deposited sequentially in the same pump down. The amorphous silicon is patterned and then the wafer is annealed whereby the refractory metal reacts with the amorphous silicon as well as single crystal silicon and polysilicon to form a silicide. The unreacted metal is then removed by wet etching.

This technique suffers from limitations such as oxidation of the titanium film during the silicon dry etch which contains oxygen species. Additionally, the photoresist stripping agent showed a tendency for attacking the refractory metal which in this case was titanium.

Polysilicon loads have been used in MOS devices for a substantial period of time. Published reports on polysilicon load processes have concentrated on two or more polysilicon layers used in conjunction with first layer polycided gate structures rather than salicided (both gate and drain) structures. A common process for forming polysilicon loads involves the following steps: gate oxide growth; deposition of polysilicon/tungsten gate material; patterning of polysilicon/tungsten gate; etching of polysilicon/tungsten gate; patterning and implantation of N+ source/drain/gate; poly 1/poly 2 dielectric deposition; patterning of polysilicon contact; deposition of a second layer of polysilicon; patterning and etching of polysilicon resistor; patterning and implantation of N+ contact. This technique does not allow the use of salicide processes which are essential for low sheet resistance of gate and source/drain regions for high performances systems. Although tungsten silicide gate material with low sheet resistance has been used extensively, the source/drain regions exhibited very high sheet resistance requiring expensive circuit solutions to get around this limitation in high performance systems.

In order to produce an acceptable contacting scheme between the second level polysilicon resistor and the first polysilicon gate or source/drain regions, it is necessary to solve the problems encountered with silicon to silicon or silicon to polysilicon interfaces. The native oxide films which are grown upon exposure of the substrate to ambient air can result in high contact resistance and process variations which significantly effect yields. Accordingly, the foregoing process was based on silicide free junctions in direct contact with the second polysilicon layer which is also free of silicide. This was followed by the resistor definition and contact patterning followed by doping implantation at the contact region to reduce the electrical resistance of the second layer of polysilicon contact.

BRIEF SUMMARY OF THE INVENTION

In one preferred embodiment, the present invention provides a process for forming a local interconnect on an MOS device. An isolation step is performed to electrically isolate various devices from each other on an integrated circuit. A polysilicon gate material is deposited on the gate oxide, patterned and etched to form N and P channel CMOS transistors. Next, N+ and P+ doping provide the gate and source/drain control regions of the CMOS transistor. A thin oxide/nitride spacer is then formed on the sides of the gate regions.

A layer of cobalt film is then deposited over the first layer of polysilicon and the active areas. This is followed by a rapid thermal anneal at 450° C. The cobalt which is in close contact with the polysilicon or the active areas forms a CoSi layer, while the cobalt in contact with the oxide or nitride does not react. The unreacted cobalt is subsequently etched from the device. The device is then subjected to another, high temperature anneal to form a low sheet resistant $CoSi_2$ film.

Next, a thin layer of undoped LPCVD polysilicon film is deposited, patterned and etched to form the various components of the local interconnect straps. A second layer of cobalt film is then deposited over the entire surface and is reacted with the second layer of polysilicon through one or two annealing steps. The cobalt reacts with all of the second layer of thin polysilicon to form $CoSi_2$ interconnects with no polysilicon remaining. The cobalt in contact with the oxide or with the previously formed CoSi$_2$ does not react and is removed by etching.

In a second embodiment of the present invention, a high resistor LPCVD polysilicon load is formed on a CMOS device either alone or simultaneously with the formation of the local interconnect described above. In this embodiment, the gate and source/drain regions of transistors are formed by conventional processes. A layer of cobalt is then deposited over the device and annealed to form CoSi$_2$ over the gate and source/drain regions.

A layer of oxide is then deposited on the wafer, patterned and etched to provide a contact region for the second level polysilicon film which will form the resistor. The polysilicon film is then deposited on the wafer, patterned and etched to form the resistor region and the local interconnect.

Another oxide layer is then deposited on the device, patterned and etched to expose the areas of the polysilicon resistor for which silicidation is desired to reduce the electrical contact resistance between the different levels of interconnect. Another layer of cobalt is then deposited on the device and annealed to form a second layer of CoSi$_2$. The unreacted cobalt is subsequently stripped off of the device.

BRIEF DESCRIPTION OF THE DRAWINGS

Reference is next made to the drawings in which like parts are designated with like numerals throughout, and in which.

DETAILED DESCRIPTION OF THE PREFERRED EMBODIMENTS

A preferred embodiment of the method of making a local interconnect for an MOS integrated circuit device is illustrated in FIGS. 1A-1I. The method includes forming a transistor in a face of a silicon wafer 10 by applying a polysilicon gate 12 over a gate oxide coating 14 in an active area surrounded by field oxide 18. Gate 12 as well as polysilicon gate 20 are formed by depositing a layer of polysilicon on the entire face of the wafer and patterning it by photomasking and etching in the usual manner. Source/drain regions 16 are created by ion implantation using standard techniques. The present invention can be used on N, P or CMOS devices.

Figure 1A:
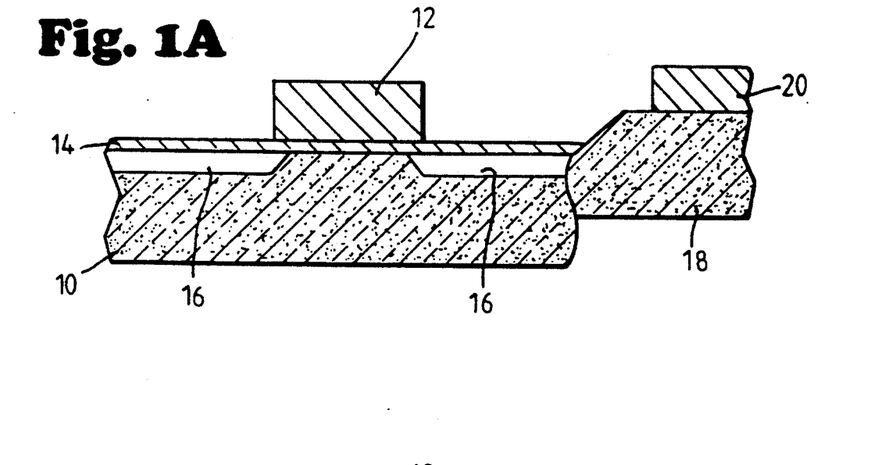
FIGS. 1A-1I are elevation views, in section, of a small part of a semiconductor wafer at successive stages of manufacture showing the formation of a local interconnect for an MOS transistor.
Figure 1B:
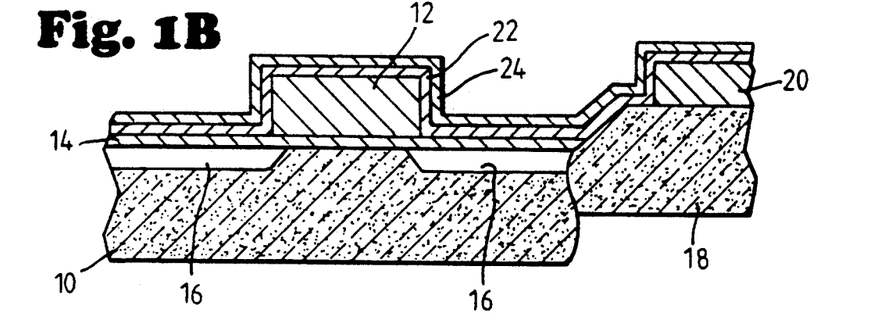
Figure 1C:
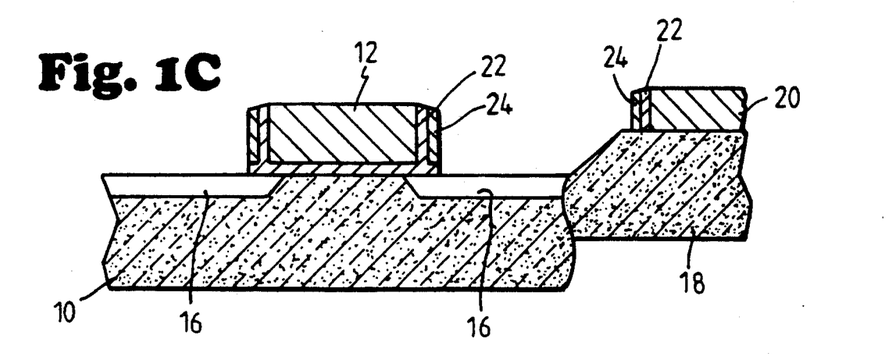

A thin oxide/nitride spacer is then formed on the sides of the gate regions as illustrated in FIGS. 1B and 1C. In the preferred embodiment, the spacers are formed by depositing a layer of oxide 22 followed by a layer of nitride 24. These layers are then selectively etched to leave the spacers on the side of the gate regions as illustrated in FIG. 1C. While the preferred embodiment uses a combination of an oxide layer and a nitride layer, it will be appreciated by those skilled in the art that the spacer could be formed from oxide or nitride alone.

Figure 1D:
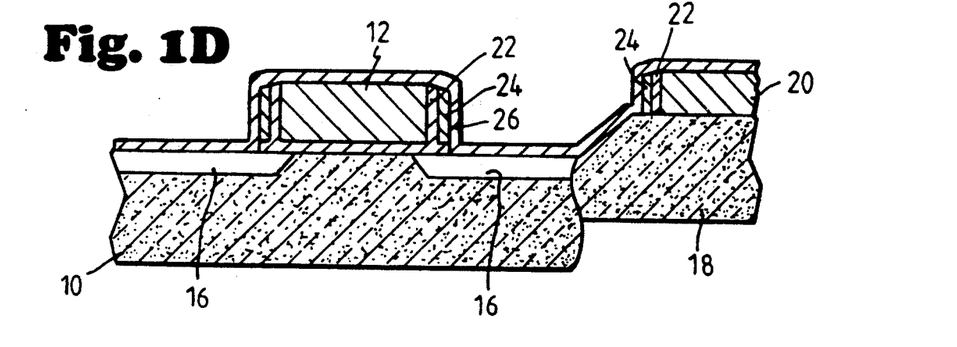

In high-density devices, the depth of the source/drain regions is shallow, and so silicide is needed to lower the sheet resistivity. In the preferred embodiment, a self aligned silicide (salicide) is formed by first depositing a coating of cobalt 26 on the surface of the wafer as illustrated in FIG. 1D. Cobalt layer 26 can be formed by sputtering and is generally formed to a thickness of about 100 to 500 Å. The device is then subjected to a rapid thermal anneal at about 450° C. The cobalt which is in close contact with the polysilicon and with the active areas forms a CoSi layer. Part of the silicon of the gate and the source/drain regions will be consumed as the silicide is formed. The cobalt which is in contact with the oxides and nitrides does not react and is subsequently etched in a solution of phosphoric, nitric and acetic acids and hydrogen peroxide.

Figure 1E:
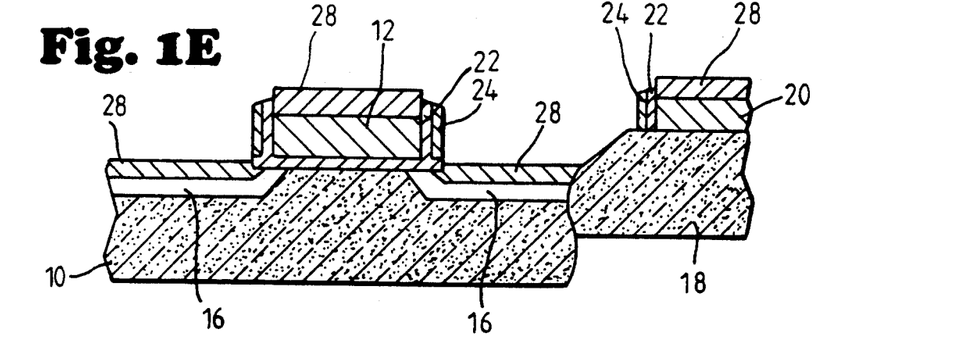

A second heat treatment is then performed at a temperature of from about 550° to 800° C. and preferably at about 700° C. to convert the CoSi to a low resistivity CoSi$_2$ layer 28.

Figure 1F:
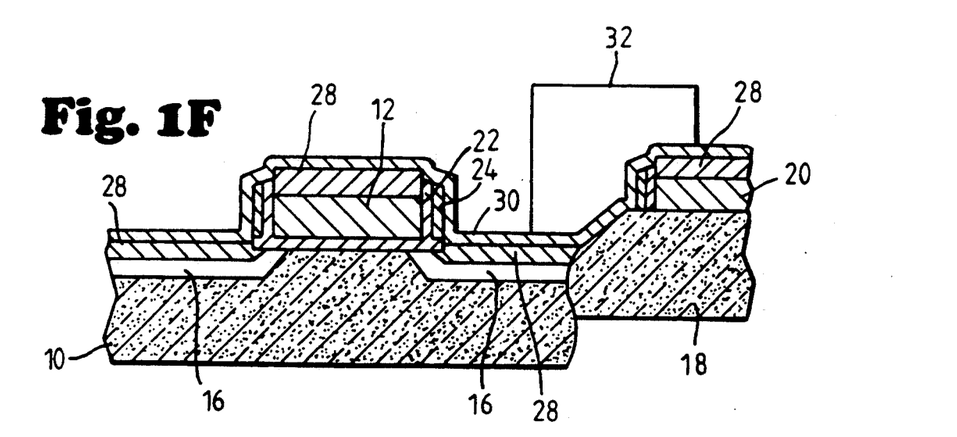
Figure 1G:
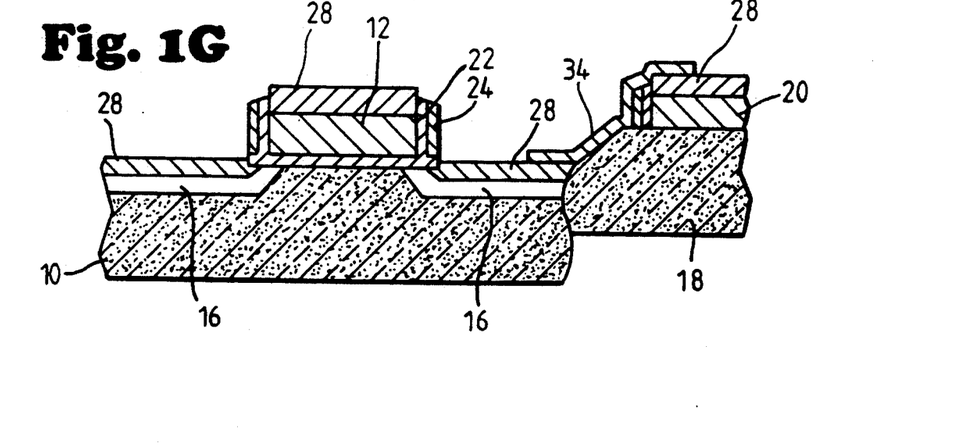

Next, as illustrated in FIGS. 1F and 1G, a thin layer of undoped LPCVD polysilicon film 30 is deposited over the wafer to a thickness of about 300 to 2,000 Å. The polysilicon is then patterned with a mask 32 and etched to form the various components of the local interconnect strap 34. Excellent etch selectivity is found between the polysilicon and the cobalt silicide. While the preferred embodiment uses polysilicon, it should also be appreciated that amorphous silicon can be used.

Figure 1H:
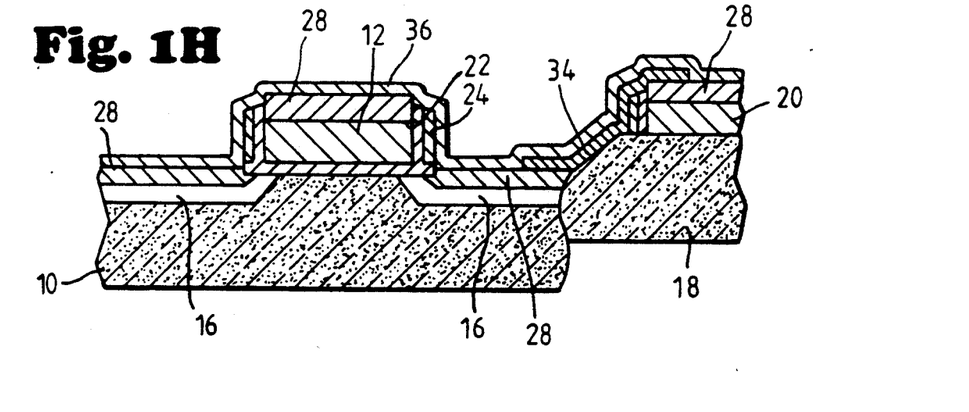

A second layer of cobalt 36 is then deposited over the entire surface of the device as illustrated in FIG. 1H. This layer of cobalt generally has a thickness of about 100 to 500 Å. The wafer is again subjected to annealing to create cobalt silicide local interconnect 38. The annealing process can be performed in either one or two steps. It is presently preferred to use two steps. Sufficient cobalt should be provided to completely react with the polysilicon strap 34 leaving no polysilicon layer. The cobalt in contact with the oxide or with the previously processed CoSi$_2$ does not react and can be removed by a wet etch as discussed above. Accordingly, thicker cobalt layers can be used with no detrimental effect since the reaction will stop as soon as the second CoSi$_2$ layer comes in contact with the first CoSi$_2$ layer.

Figure 1I:
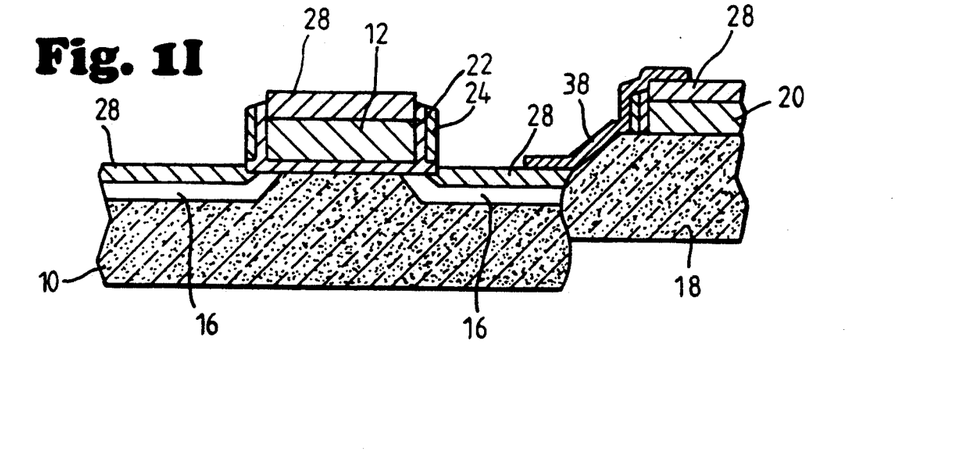

The cobalt conversion to CoSi$_2$ stops when all of the silicon has been consumed and the second level silicide reaches and joins with the first layer of silicide. This means that the first CoSi$_2$ layer does not get any thicker and the reverse junction leakage current of the N+ and P+ junctions does not increase as a result of this second silicidation step.

Figure 2A:
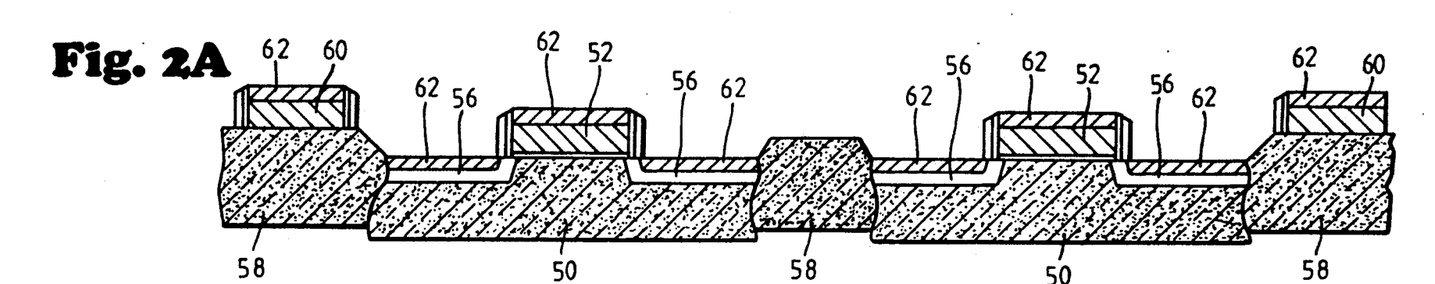
FIGS. 2A-2M are elevation views, in section, of a small part of a semiconductor wafer at successive stages of manufacture showing the formation of a high resistor polysilicon load and a local interconnect.

Reference is next made to FIGS. 2A-2M which illustrate the simultaneous formation of a high resistor polysilicon load and a local interconnect on a semiconductor wafer. Referring first to FIG. 2A, a pair of transistors are formed in a silicon wafer 50 and include polysilicon gates 52 and source/drain regions 56 which are surrounded by field oxide 58. Additional gates 60 are formed on portions of the field oxide.

Figure 2B:
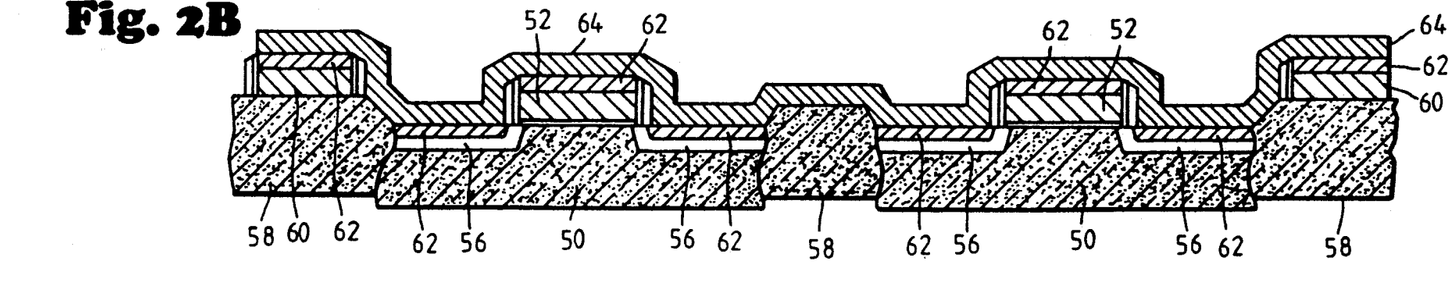
Figure 2C:
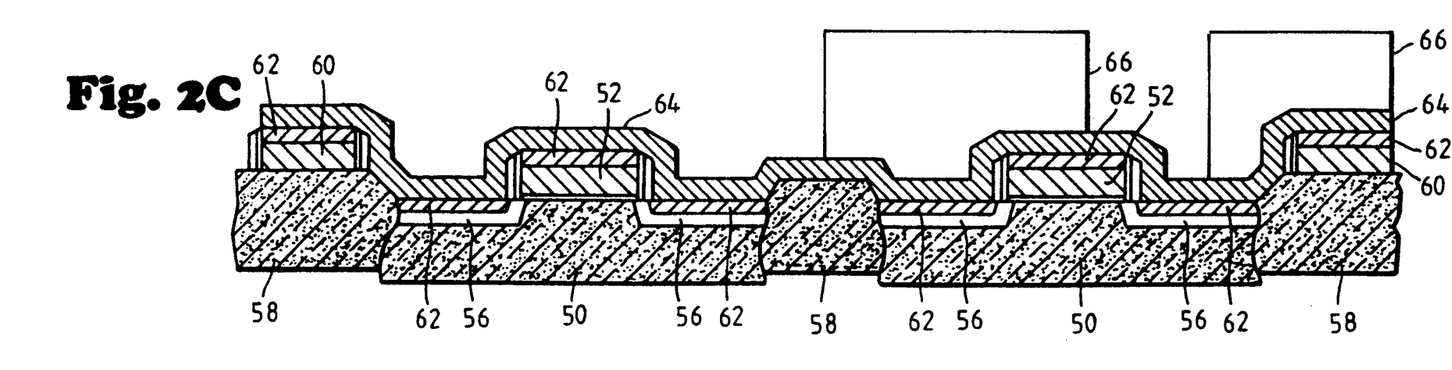
Figure 2D:
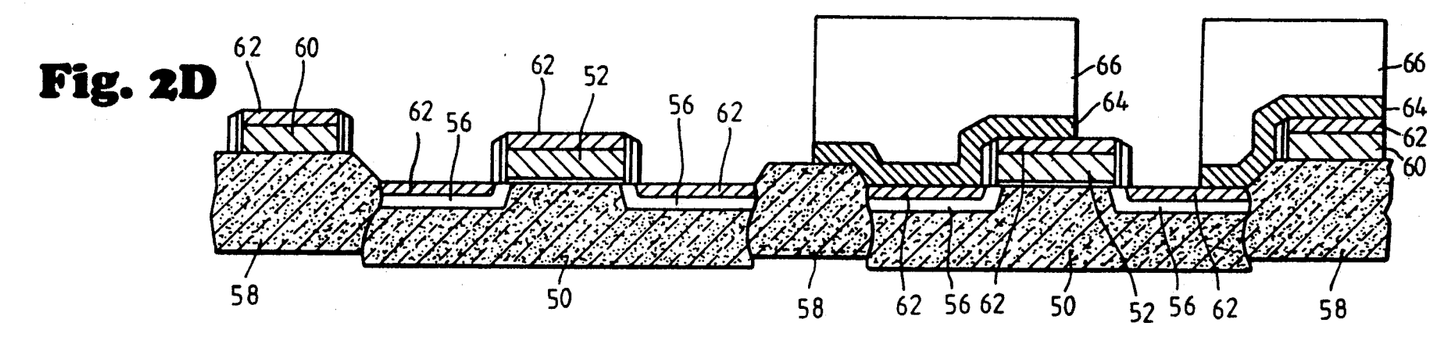
Figure 2E:
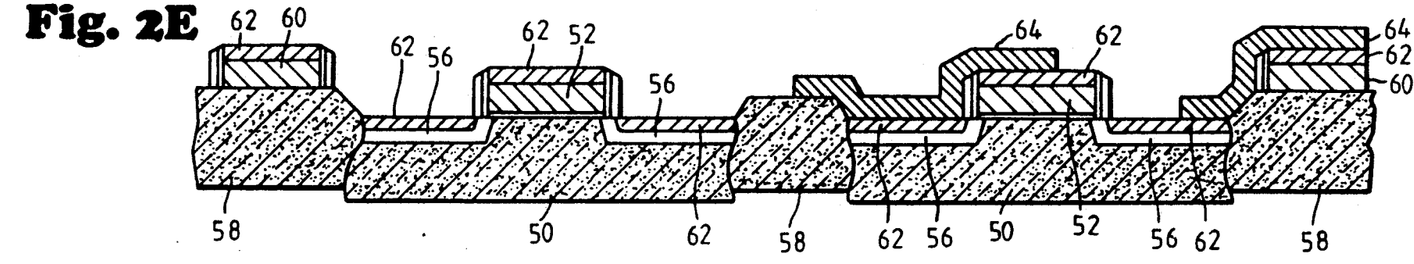

Each of the gates and source/drain regions includes a layer of cobalt silicide 62 which is formed according to the process described above. Referring now to FIG. 2B, a layer of silicon oxide 64 is next deposited on the surface of the wafer 50 to a thickness of about 2,000 Å. The oxide layer is then patterned and etched as illustrated in FIGS. 2C through 2E using masks 66 to provide a contact region for the second level polysilicon film.

Figure 2F:
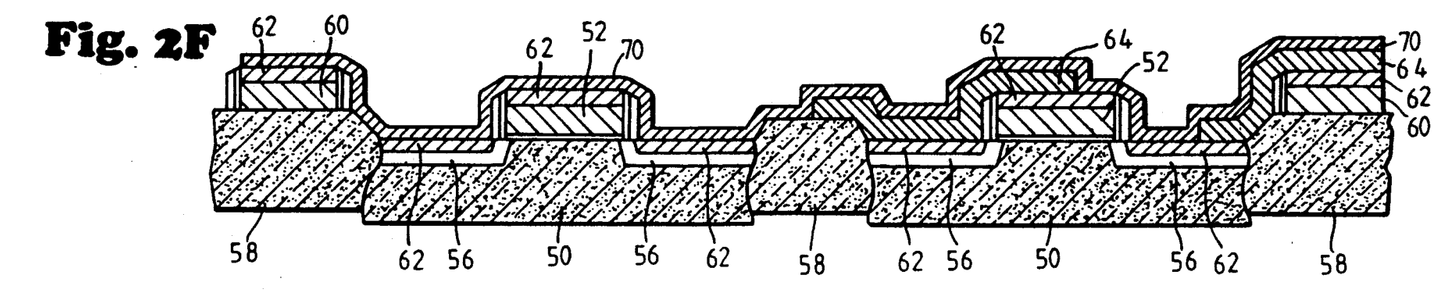
Figure 2G:
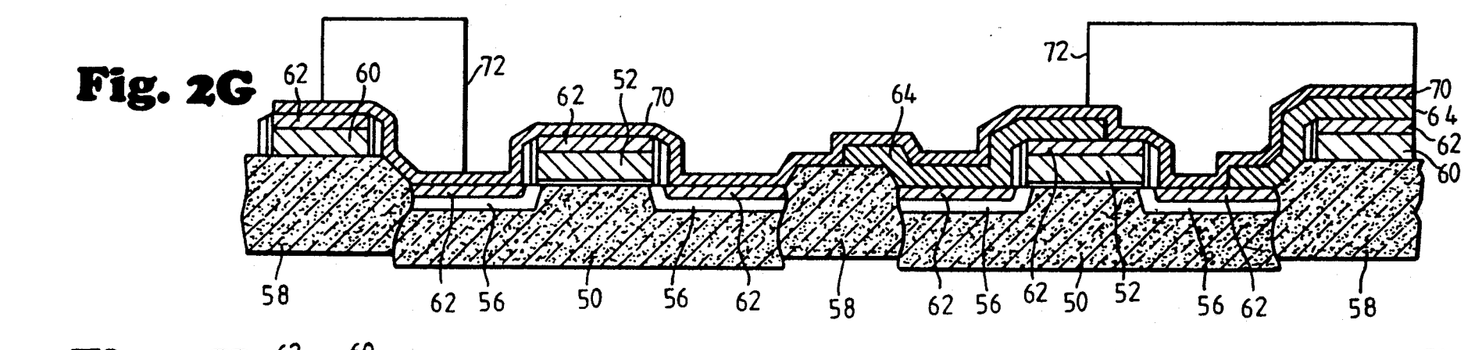
Figure 2H:
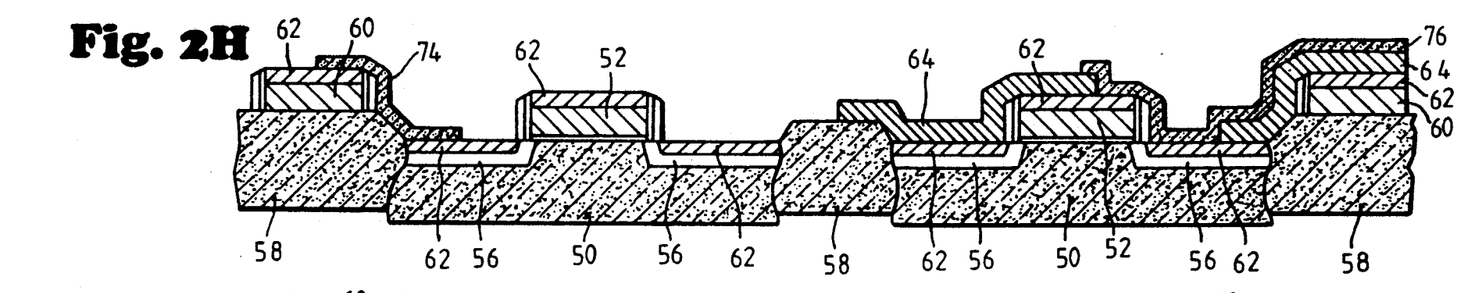

As illustrated in FIG. 2F, a second layer of polysilicon 70 is then formed over the surface of the wafer. This layer of polysilicon film generally has a thickness of about 300 to 2,000 Å. Polysilicon 70 is then patterned and etched using masks 72 to simultaneously form the local interconnect 74 and the resistor region 76 as illustrated in FIGS. 2G and 2H.

Figure 2I:
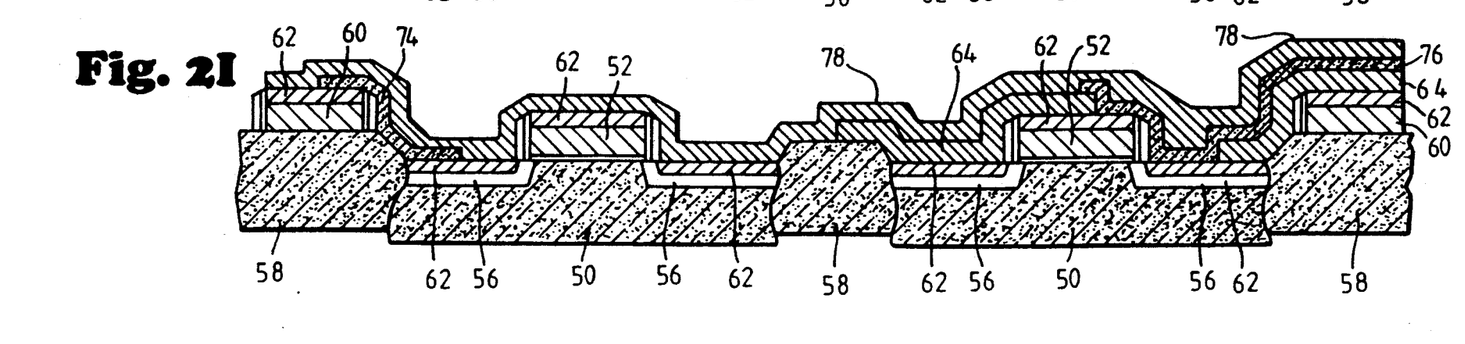
Figure 2J:
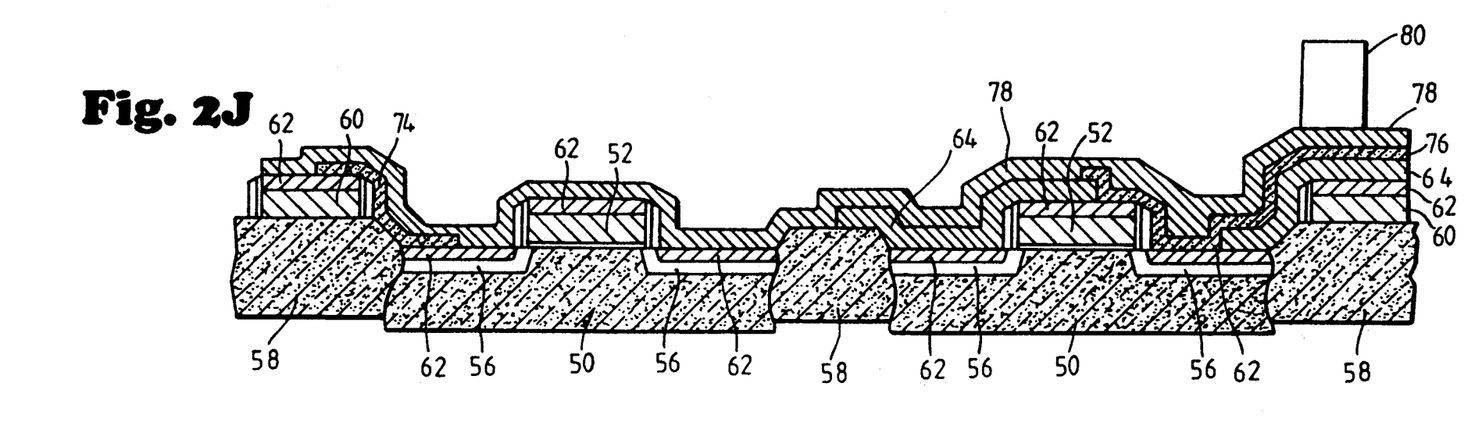
Figure 2K:
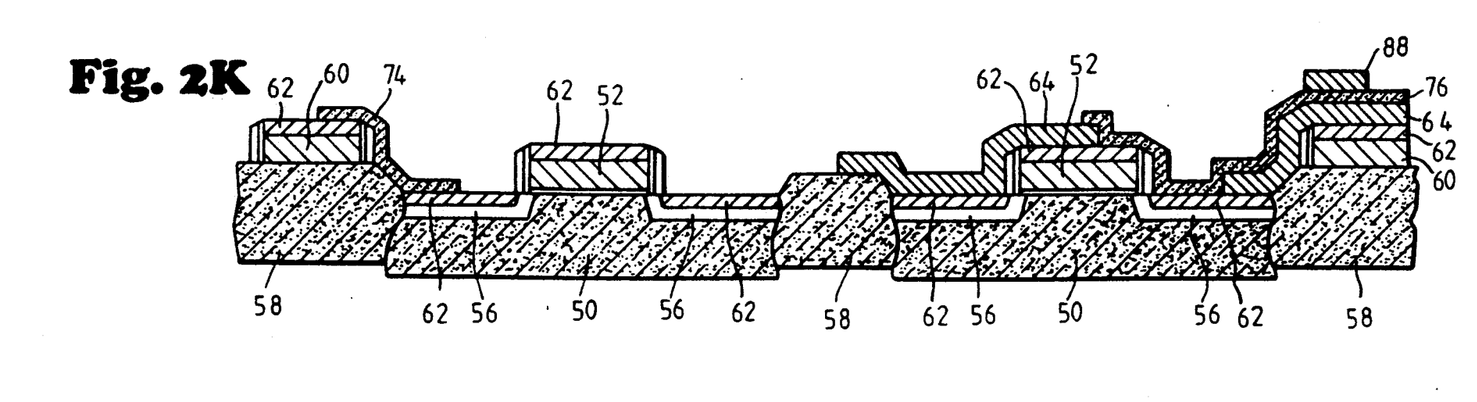

In order to form a selective silicided polysilicon resistor, a new layer of oxide 78 with a thickness of about 1,000 Å is next deposited on the wafer. As illustrated in FIGS. 2I through 2K, this oxide layer is then patterned and etched using a mask 80 to shield the portions of the polysilicon which will not be subjected to silicidation.

Figure 2L:
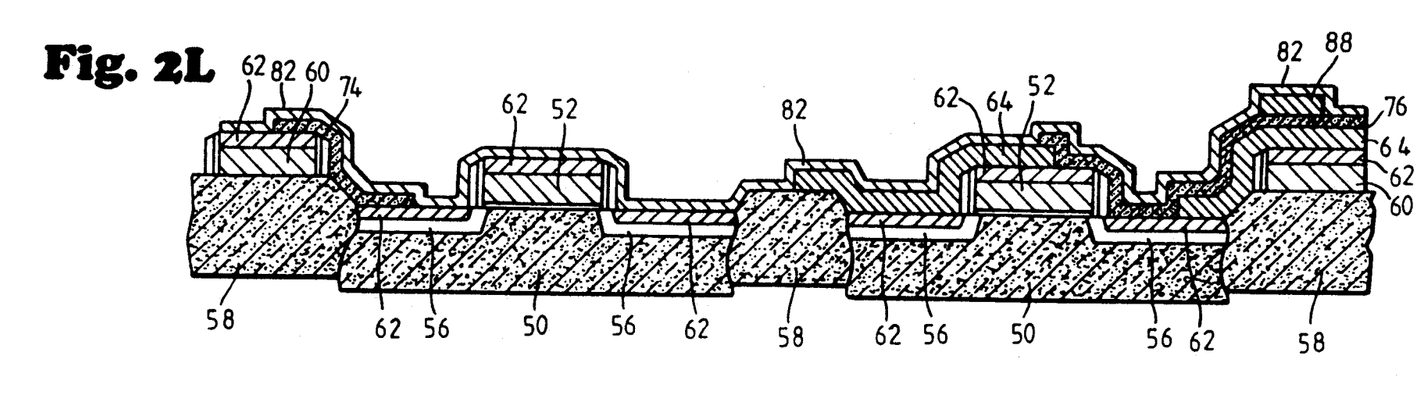
Figure 2M:
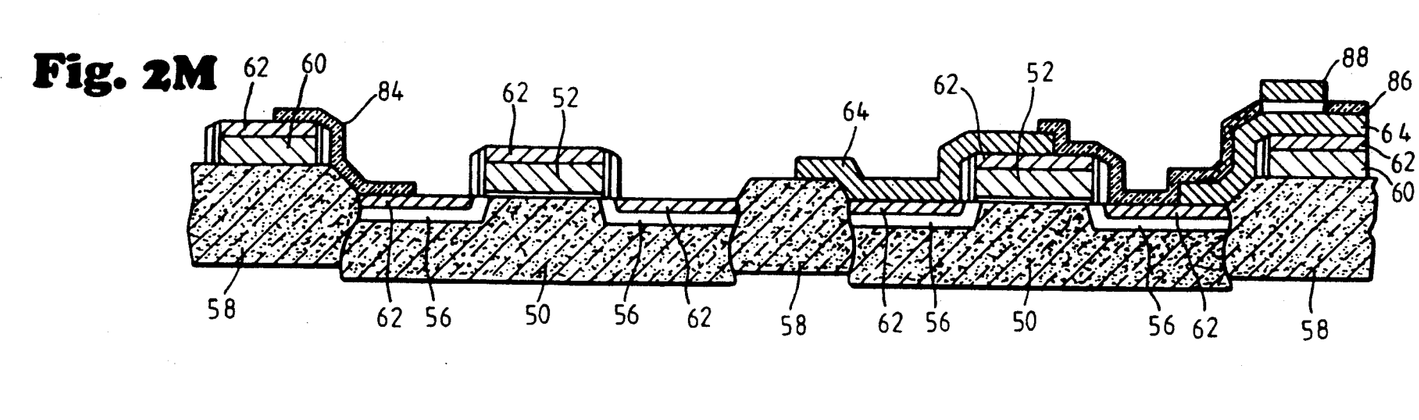

Referring now to FIG. 2L, a cobalt layer 82 is then formed over the surface of the wafer. This cobalt layer has a thickness of about 100–400 Å and is annealed in a rapid thermal annealing system to form a second layer of $CoSi_2$ to form the $CoSi_2$ local interconnect 84 and the high resistor polysilicon load 86. The resistivity of the resistor is determined by the thickness of the polysilicon layer and the size of the oxide mask 88.

With the present invention, no dopant is needed in the resistor contact region or in the resistor body since the second $CoSi_2$ layer is in close contact with the first $CoSi_2$ layer, providing good electrical contact. Since no dopant is used, prior art problems of lateral diffusion into the resistor is eliminated. Accordingly, the present invention permits the formation of very short resistors with high values.

While the present invention has been described with reference to the preferred embodiments, the description is not meant to be construed in a limiting sense. Various modifications of the disclosed embodiments will be apparent to persons skilled in the art upon reference to this description. For example, it will be readily apparent that the high resistor polysilicon load can be formed independent of the local interconnects. Additionally, the process of depositing polysilicon, converting it to $CoSi_2$ can be repeated many times to provide many different layers of interconnects. It is intended that the following claims be interpreted to embrace any and all such modifications and changes.

What is claimed is:

1. A process for forming a local interconnected on a semiconductor device, comprising the steps of:
   providing a partially fabricated semiconductor device having a first layer of $CoSi_2$ in the gate and source/drain regions;
   depositing a layer of silicon on the surface of said device;
   patterning and etching said silicon to define an area as a local interconnect;
   depositing a layer of cobalt over the surface of said device; and
   annealing said device at conditions such that said silicon and said cobalt react to form a second layer of $CoSi_2$ in close contact with said first layer of $CoSi_2$.

2. A process according to claim 1 wherein said silicon is polysilicon.

3. A process according to claim 1 wherein said silicon is amorphous silicon.

4. A process according to claim 1 wherein said annealing step is performed in a nitrogen atmosphere.

5. A process according to claim 2 wherein said polysilicon layer is applied by LPCVD.

6. A process according to claim 1 wherein said cobalt is applied by sputtering.

7. A process according to claim 1 wherein said layer of cobalt consumes all of said silicon.

8. A process for forming a high resistor polysilicon load on a semiconductor device, comprising the steps of:
   providing a partially fabricated semiconductor device having a first layer of $CoSi_2$ in the gate and source/drain regions;
   depositing an oxide layer on a surface of said device;
   patterning said oxide layer to form contact windows extending to the surface beneath said oxide layer;
   depositing a layer of polysilicon over the surface of said device;
   patterning and etching the polysilicon to form a resistor region;
   depositing and patterning an oxide layer to form a mask over a portion of the polysilicon which will provide the resistive load;
   depositing a layer of cobalt over said device; and
   annealing said device under conditions such that the cobalt and polysilicon react to form a second layer of $CoSi_2$ in close contact with said first layer of $CoSi_2$.

9. A process according to claim 8 wherein said annealing step is performed in a nitrogen atmosphere.

10. A process according to claim 8 wherein said polysilicon is applied by LPCVD.

11. A process according to claim 8 wherein said cobalt is applied by sputtering.

12. A process according to claim 8 wherein said cobalt consumes all of said polysilicon except said portion which supplies the resistive load.

13. A process for simultaneously forming a local interconnect and a high resistor polysilicon load on a semiconductor device, comprising the steps of:
   providing a partially fabricated semiconductor device having a first layer of $CoSi_2$ in the gate and source/drain regions;
   depositing an oxide layer on a surface of said device;
   patterning and etching said oxide layer to form contact windows extending to the surface beneath said oxide layer;
   depositing a layer of polysilicon over the surface of said device;
   patterning and etching the polysilicon to define areas as a local interconnect region and a resistor region;
   depositing and patterning an oxide layer to form a mask over a portion of the polysilicon in said resistor region which will supply the resistive load;
   depositing a layer of cobalt over said device; and
   annealing said device at conditions such that the cobalt and polysilicon react to form a second layer of $CoSi_2$ in close contact with said first layer of $CoSi_2$.

* * * * *

UNITED STATES PATENT AND TRADEMARK OFFICE
CERTIFICATE OF CORRECTION

PATENT NO. : 5,266,156
DATED : November 30, 1994
INVENTOR(S) : Nasr

It is certified that error appears in the above-indentified patent and that said Letters Patent is hereby corrected as shown below:

Column 1, line 38, "4,657,866" should be --4,676,866--.

Column 5, line 41, "interconnected" should be

--interconnect--.

Signed and Sealed this

Thirty-first Day of May, 1994

Attest:

BRUCE LEHMAN

*Attesting Officer*        *Commissioner of Patents and Trademarks*